United States Patent [19]
Takase

[11] 4,092,819
[45] June 6, 1978

[54] ELECTRONIC TIMEPIECE CIRCUIT

[75] Inventor: Tsuneo Takase, Yokohama, Japan

[73] Assignee: Tokyo Shibaura Electric Co., Ltd., Kawasaki, Japan

[21] Appl. No.: 702,198

[22] Filed: Jul. 2, 1976

[30] Foreign Application Priority Data

Jul. 2, 1975 Japan ................................ 50-80984

[51] Int. Cl.[2] ...................... G04C 3/00; G04C 21/00; H03K 21/32

[52] U.S. Cl. ................................ 58/23 R; 58/38 R; 328/48; 364/770

[58] Field of Search ............... 58/4 A, 23 R, 38, 38 P, 58/50 R; 235/92 T, 92 PE, 169, 170; 324/186, 170; 328/48, 110

[56] References Cited

U.S. PATENT DOCUMENTS

| | | | |
|---|---|---|---|
| 3,719,932 | 3/1973 | Cappon | 340/173 AD |
| 3,798,428 | 3/1974 | Izawa | 235/92 T |
| 3,934,233 | 1/1976 | Fisher | 340/173 R |
| 3,986,333 | 10/1976 | Kimura | 58/23 R |
| 3,988,886 | 11/1972 | Kashio | 58/85.5 |

*Primary Examiner*—Edith S. Jackmon
*Attorney, Agent, or Firm*—Finnegan, Henderson, Farabow & Garrett

[57] ABSTRACT

An electronic timepiece circuit wherein time data is shifted through a closed loop formed of a memory circuit, correction circuit and adder to count time upon receipt of a timing pulse, the memory circuit being composed of a plurality of static complementary MOS transistor type random access memory cells arranged in matrix form.

5 Claims, 4 Drawing Figures

ELECTRONIC TIMEPIECE CIRCUIT

This invention relates to an electronic timepiece circuit, and more particularly to an electronic timepiece circuit, wherein a memory circuit stored with time data is formed of a plurality of random access memory cells arranged in the matrix form.

Generally, the time counting system of an electronic timepiece includes what is called the static system and the dynamic system.

With the static system, pulses generated by a crystal oscillator are passed through a frequency divider to be emitted at a period of, for example, one second. When a "second" counter counts 60 pulses, then an output from the "second" counter actuates the succeeding "minute" counter. Similarly, when the "minute" counter counts 60 pulses, then an output from the "minute" counter puts the following "hour" counter into operation. Thus, the "second", "minute" and "hour" counters are operated in turn. Outputs or time data delivered from the respective counters are displayed through the corresponding decoders.

As mentioned above, the static system is a carry type in which time counting pulses are carried from the lower to the higher order counting section, each time the pulses reach a prescribed number. Since time data is stored longer in the "hour" counter, frequency clock pulses are supplied less often to the "hour" counter. To this end, the respective counters are formed of static shift registers. Therefore, the static type electronic timepiece circuit indeed has the advantage that, power consumption is small. But the static type electronic timepiece circuit is still accompanied with the drawbacks that provision both of static shift registers and decoders corresponding to the respective counters result in an increase in the number of elements used and consequently a complicated circuit arrangement and the chip for circuit integration will become unsuitably large.

In contrast, the dynamic system comprises a closed loop formed of a memory circuit stored with time data and an adder for adding up time data. Time data of the "second", "minute" and "hour" stored in the memory circuit are continuously shifted through the closed loop upon receipt of clock pulses. Time data displayed in the lower digit position of the "second" section is increased by one, each time one shift is made through the closed loop. The result of said addition is displayed through a common decoder to the "second", "minute" and "hour" counters.

This dynamic system wherein a large amount of time data denoting the "second", "minute" and "hour" is shifted upon receipt of pulses enables a memory register to be formed of a dynamic shift register having fewer elements than the static shift register and further admits of application of a common decoder to the "second", "minute" and "hour" counters. Therefore, the time data shifting system has the advantage that a chip for circuit integration can have a favorably small size.

Though regarded as more suitable from the standpoint of integrating an electronic timepiece circuit, yet the dynamic system is not always satisfactory when power consumption is also taken into account. The reason is that a dynamic shift register used as a memory circuit is so designed as to cause a large amount of time data to be all shifted at the same time in the form of a pulse chain each time a clock pulse is received; and time data must have an extremely high frequency for the above-mentioned simultaneous shifting, resulting in large power consumption.

It is accordingly the object of this invention to provide an electronic timepiece circuit which not only consumes a small amount of power but also suits integration.

According to an aspect of this invention, there is provided a dynamic type electronic timepiece circuit, wherein a memory circuit stored with time data is formed of a plurality of random access memory cells arranged in the matrix form; it is unnecessary simultaneously to shift a large amount of time data in the form of a pulse chain as has been the case with the prior art dynamic system, thereby decreasing power consumption; and there is used as the memory cell a static complementary MOS transistor type random access memory cell which includes fewer components than a static shift register cell, thereby decreasing the size of a chip for circuit integration.

This invention can be more fully understood from the following detailed description when taken in conjunction with the accompanying drawings, in which.

Figure 1:
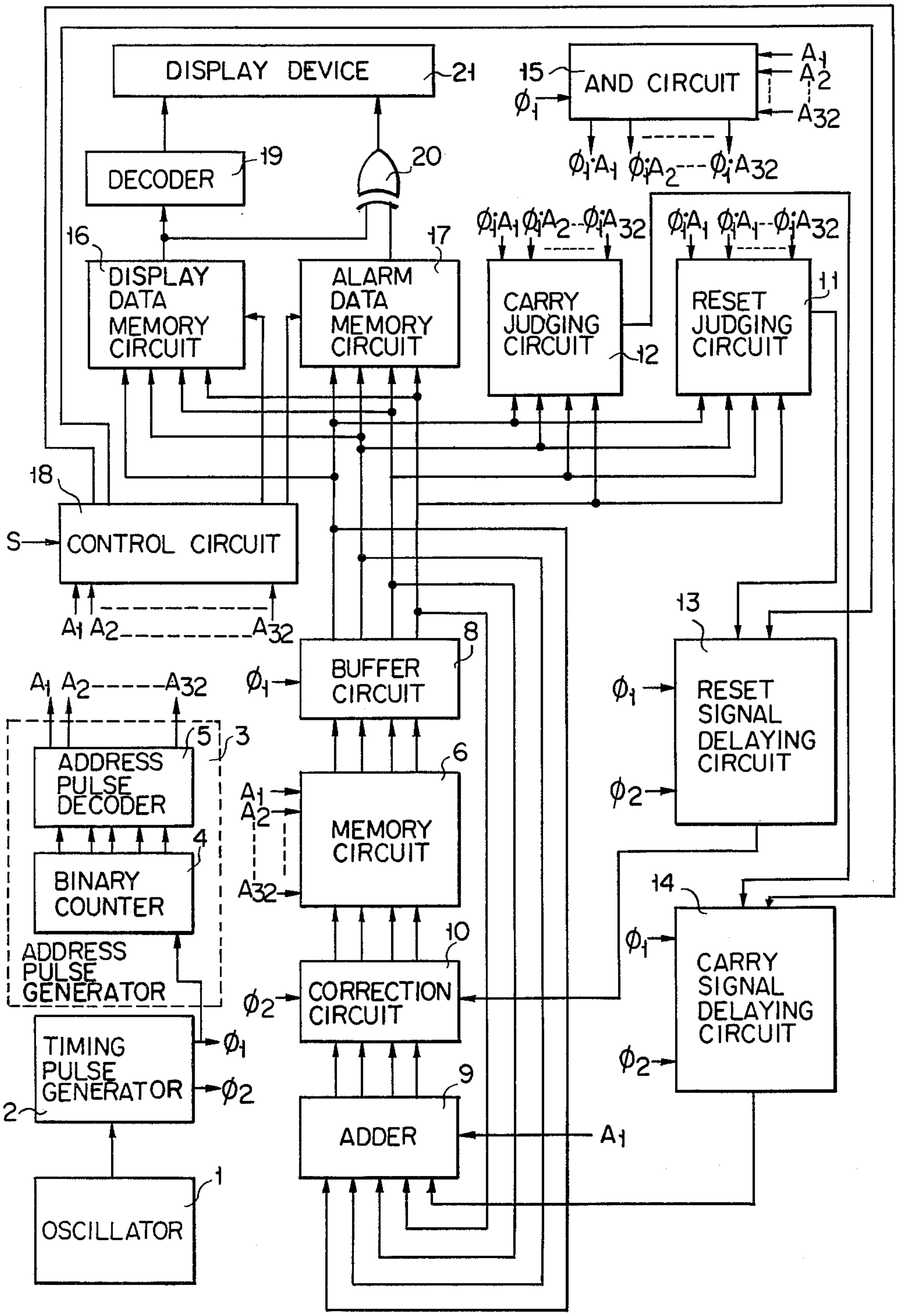
FIG. 1 is a block circuit diagram of an electronic timepiece circuit embodying this invention.
Figure 2:
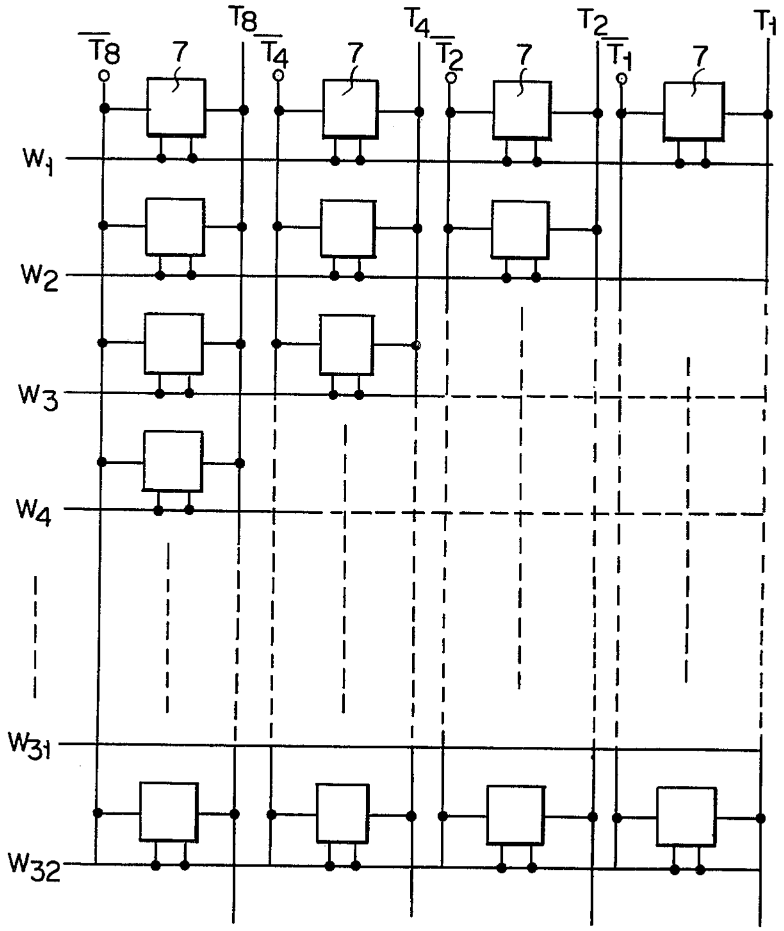
FIG. 2 is a detailed view of a memory circuit used with the electronic timepiece circuit of FIG. 1.

There will now be described by reference the appended drawings the arrangement and operation of an electronic timepiece circuit embodying this invention. Referring to FIG. 1, an output terminal of a clock pulse oscillator 1 for producing clock pulses having a frequency of, for example, 32.768 kHz is connected to an input terminal of a timing pulse generator 2. The timing pulse generator 2 has a first output terminal for issuing a first timing pulse used in reading out time data, and a second output terminal for sending forth a second timing pulse used in writing time data. The first output terminal of the timing pulse generator 2 is connected to an address pulse generator 3 for emitting an address pulse upon receipt of a clock pulse from the timing pulse generator 2. With this embodiment, the address pulse generator 3 comprises a five-stage binary counter 4 whose count changes with the supply of said first read timing pulse and an address decoder 5 for sending forth an address pulse upon receipt of a successively changing output from the binary counter 4. The address pulse generator 3 has 32 output terminals, which are connected to the corresponding control terminals of a memory circuit 6. This memory circuit 6 comprises a plurality of fundamental elements such as static complementary MOS transistor type random access memory cells arranged, as shown in FIG. 2, in the form of a matrix consisting of 32 rows and four columns.

Figure 3:
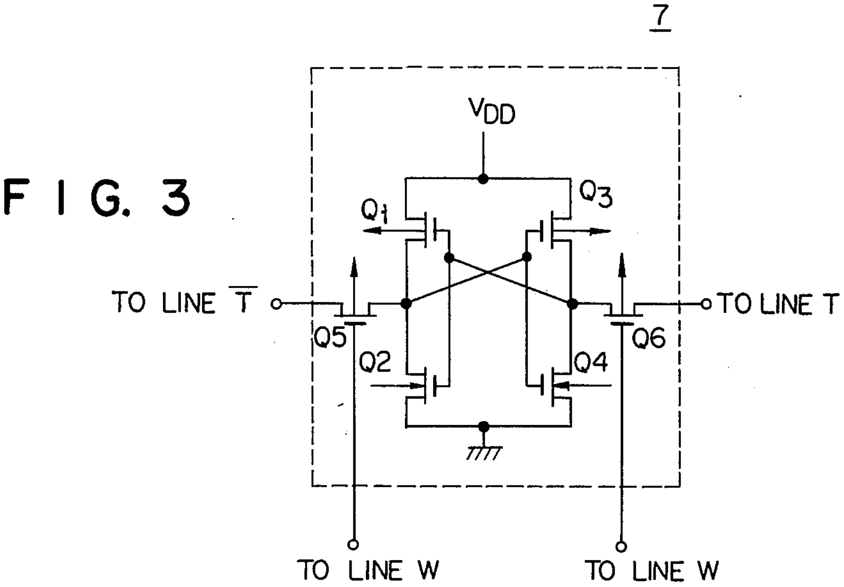
FIG. 3 shows the circuit arrangement of a static complementary MOS transistor type random access memory cell, a fundamental element included in the memory circuit of FIG. 2.

The circuit arrangement of a static complementary MOS transistor type random access memory cell is already known and need not be described herein. For illustration, however, FIG. 3 presents said circuit arrangement. Referring to FIG. 3, an MOS transistor $Q_1$ is of the *p* channel type, and an MOS transistor $Q_2$ is of the *n* channel type. Both transistor $Q_1$, $Q_2$ are complementary to each other. Similarly, an MOS transistor $Q_3$ is of the $p$ channel type, and an MOS transistor $Q_4$ is of the $n$ channel type. Both transistors $Q_3$, $Q_4$ are complementary to each other. These MOS transistors $Q_1$, $Q_2$, $Q_3$, $Q_4$ jointly constitute a flip-flop circuit. Both MOS transistors $Q_5$, $Q_6$ are of the $p$ channel type and constitute gate circuits for reading and writing time data. The operation of a memory cell constructed as described above is already known, and description thereof is omitted. Referring to FIG. 1, output terminals of the memory circuit 6 are connected to input terminals of a buffer circuit 8, whose output terminals are connected to first input terminals of an adder 9. Outputs of this adder 9 are connected to input terminals of a correction circuit 10, whose output terminals are connected to input terminals of the memory circuit 6. The memory circuit 6, buffer circuit 8, adder 9 and correction circuit 10 jointly constitute a closed loop. Time data of the "second", "minute" and "hour" are shifted to count time. Control terminal of the buffer circuit 8 is connected to the first output terminal of the timing pulse generator 2. A second input terminal of the adder 9 is connected to one of the output terminals of the address pulse generator 3. First control terminal of the correction circuit is connected to a second output terminal of the timing pulse generator 2.

Output terminals of the buffer circuit 8 are connected to input teminals of a reset-judging circuit 11 for determining whether a time data should be cleared and also to input terminals of a carry-judging circuit 12 for deciding whether time data should be carried. A reset signal output terminal of the reset-judging circuit 11 is connected to a first input terminal of a reset signal-delaying circuit 13. A carry signal output terminal of the carry-judging circuit 12 is connected to a first input terminal of a carry signal-delaying circuit 14. An output terminal of the reset signal-delaying circuit 13 is connected to a second control terminal of a correction circuit 10. An output terminal of the carry signal-delaying circuit 14 is connected to a third input terminal of the adder 9. Control terminals of the reset-judging circuit 11 and those of the carry-judging circuit 12 are connected to the corresponding output terminals of an AND circuit 15. A first input terminal of the AND circuit 15 is connected to a first output terminal of the timing pulse generator 2. Second input terminals of said AND circuit 15 are connected to output terminals of the address pulse generator 3. Output terminals of the buffer circuit 8 are connected to input terminals of a display data memory circuit 16 and input terminals of an alarm data memory circuit 17. A control terminal of the display data memory circuit 16 is connected to a first output terminal of a control circuit 18. A control terminal of the alarm data memory circuit 17 is connected to a second output terminal of the control circuit 18, a third output terminal of which is connected to a second input terminal of the reset signal-delaying circuit 13 and a fourth output terminal of which is connected to a second input terminal of the carry signal-delaying circuit 14. The control circuit 18 which is operated by an external switch is used to correct and display time and indicate a point of time at which an alarm should be given.

Control terminals of the control circuit 18 is connected to the output terminals of the address pulse generator 3. An output terminal of the display data memory circuit 16 is connected to an input terminal of a decoder 19 and also to one of the input terminals of an exclusive OR circuit 20. An output terminal of the alarm data memory circuit 17 is connected to the other input terminal of the exclusive OR circuit 20. An output terminal of the decoder 19 is connected to a first input terminal of a display device 21. An output terminal of the exclusive OR circuit 20 is connected to a second input terminal of the display device 21.

There will now be described the operation of an electronic timepiece circuit embodying this invention. The clock pulse generator 1 including, for example, a quartz-oscillating element produces clock pulses having a frequency of, for example, 32.768 kHz. A clock pulse emitted by the clock pulse generator 1 is conducted to the timing pulse generator 2 for frequency division. The timing pulse generator 2 sends forth two timing pulses $\phi_1$, $\phi_2$ (FIGS. 4(A), 4(B)) having a frequency of 8.192 kHz. As later detailed, the timing pulse $\phi_1$ is used in reading out time data, and the timing pulse $\phi_2$ is used in writing time data. The read timing pulse $\phi_1$ is also supplied to the address pulse generator 3, and applied in sending forth, for example, 32 address pulses $A_1$ to $A_{32}$ each having a frequency of 256 Hz. The address pulse generator 3 for producing 32 address pulses $A_1$ to $A_{32}$ comprises the five-stage binary counter 4 whose count successively varies with read timing pulses $\phi_{1a}$, $\phi_{1b}$, $\phi_{1c}$ . . . received and the address decoder 5 for converting outputs from the binary counter 4 into address pulses $A_1$ to $A_{32}$.

Figure 4:
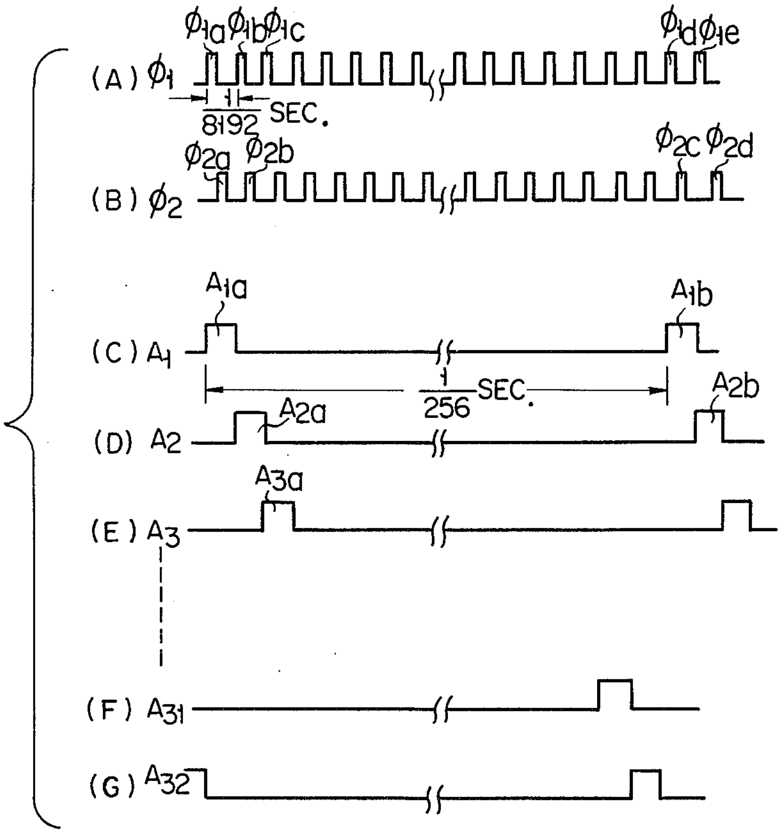
FIG. 4 is a timing chart of the block circuit diagram of FIG. 1.

There will now be described by reference to FIG. 4 the operation of the address pulse generator 3. Now let it be assumed that the timing pulse generator 2 sends forth a first read timing pulse $\phi_{1a}$ belonging to the read timing pulse group $\phi_1$ to a binary counter 4. At this time, the content of the binary counter 4, namely, an address code is designated as "0,0,0,0,0". When decoding this address code "0,0,0,0,0", the address decoder 5 produces the corresponding address pulse $A_{1a}$. When the binary counter 4 receives a second read timing $\phi_{1b}$ from the timing pulse generator 2, then the address code of said binary counter 4 is changed into "0,0,0,0,1". Then the address decoder 5 issues the corresponding address pulse $A_{2a}$. When a third read timing pulse $\phi_{1c}$ is sent to the binary counter 4, then the code of the data stored in the binary counter 4 is changed into "0,0,0,1,0", and the address decoder 5 sends forth the corresponding address pulse $A_{3a}$. Later as described above, each time the binary counter 4 is supplied with a read timing pulse $\phi_1$ from the timing pulse generator 2, address pulses $A_4$, $A_5$ . . . $A_{32}$ are successively drawn out of the address decoder 5. The address pulses $A_1$ to $A_{32}$ are sent forth from the address decoder 5 or address pulse generator 3, each time the binary counter 4 of the address pulse generator 3 receives a read timing pulse $\phi_1$ from the timing pulse generator 2. Therefore, the address pulse generator 3 issues an address pulse at the same period as the timing pulse, namely, at a period of 1/8192 second. A length of time required for the address pulse generator 3 to produce 32 different address pulses at the above-mentioned period of 1/8192 is 1/8192 (sec) $\times$ 32 = 1/252 seconds.

Outputs from the address decoder 5, namely, address pulses $A_1$ to $A_{32}$ delivered from the address pulse generator 3 are transmitted to the memory circuit 6.

The memory circuit 6 is formed, as previously mentioned of 128 fundamental elements 7 such as static complementary MOS transistor type random access memory cells arranged in the matrix form (32 rows $\times$ four columns) shown in FIG. 2. Fundamental elements 7 belonging to each column are connected by a pair of data lines as $\bar{T}_8$-$T_8$, $\bar{T}_4$-$T_4$, $\bar{T}_2$-$T_2$ and $\bar{T}_1$-$T_1$. On the other hand, fundamental elements 7 forming each row are connected by word-selecting lines (write-read selecting lines) $W_1$ to $W_{32}$. The number of rows included in the matrix corresponds to "a number of time data" set forth in the patent claims of this invention, and the number of columns included in the matrix corresponds to "a number of bits required to represent a code of each time data" expressed in the patent claims of the invention.

A word-selecting line $W_1$ of the memory circuit 6 arranged in the above-mentioned matrix form is supplied with an address pulse $A_1$ having a period of 1/256 second. A word-selecting line $W_2$ is supplied with an address pulse $A_2$ having a period of 1/256 second after being delayed from the address pulse $A_1$ by a period of a read timing pulse $\phi_1$, namely, by 1/8192 second. Similarly, a word-selecting line $W_3$ receives an address pulse $A_3$ having a period of 1/256 second after being delayed from the address pulse $A_2$ by a period of a timing pulse $\phi_1$, namely, by 1/8192 second. The other word-selecting lines $W_4$ to $W_{32}$ are supplied with address pulses $A_4$ to $A_{32}$ each having a period of 1/256 second after being delayed by 1/8192 second in succession.

The address pulse generator 3 issues address pulses at the same period (1/8192 second) as that at which the timing pulse generator 2 sends forth timing pulses. Thus, the memory circuit 6 is supplied with address pulses at a period of 1/8192.

The following table shows the relationship of data stored in the binary counter 4, namely, address codes, 32 address pulses $A_1$ to $A_{32}$ converted by the address decoder 5 from outputs of the binary counter 4, or binary codes, and time data stored in the memory cells of the memory circuit 6 designated by the address pulses $A_1$ to $A_{32}$.

Table

| Address code | Address pulse | Data |
|---|---|---|
| 0 0 0 0 0 | $A_1$ | 1/256 sec. |
| 0 0 0 0 1 | $A_2$ | 1/16 sec. |
| 0 0 0 1 0 | $A_3$ | 1 sec. |
| 0 0 0 1 1 | $A_4$ | 10 sec. |
| 0 0 1 0 0 | $A_5$ | 1 min. |
| 0 0 1 0 1 | $A_6$ | 10 min. |
| 0 0 1 1 0 | $A_7$ | hr. |
| 0 0 1 1 1 | $A_8$ | PM/AM |
| 0 1 0 0 0 | $A_9$ | week day |
| 0 1 0 0 1 | $A_{10}$ | 1 day |
| 0 1 0 1 0 | $A_{11}$ | 10 days |
| 0 1 0 1 1 | $A_{12}$ | month |
| 0 1 1 0 0 | $A_{13}$ | Alarm (1) 1 min. |
| 0 1 1 0 1 | $A_{14}$ | " (1) 10 min. |
| 0 1 1 1 0 | $A_{15}$ | " (1) hr. |
| 0 1 1 1 1 | $A_{16}$ | " (1) PM/AM |
| 1 0 0 0 0 | $A_{17}$ | " (2) 1 min. |
| 1 0 0 0 1 | $A_{18}$ | " (2) 10 min. |
| 1 0 0 1 0 | $A_{19}$ | " (2) hr. |
| 1 0 0 1 1 | $A_{20}$ | " (2) PM/AM |
| 1 0 1 0 0 | $A_{21}$ | " (3) 1 min. |
| 1 0 1 0 1 | $A_{22}$ | " (3) 10 min. |
| 1 0 1 1 0 | $A_{23}$ | " (3) hr. |
| 1 0 1 1 1 | $A_{24}$ | " (3) PM/AM |
| 1 1 0 0 0 | $A_{25}$ | " (4) 1 min. |
| 1 1 0 0 1 | $A_{26}$ | " (4) 10 min. |
| 1 1 0 1 0 | $A_{27}$ | " (4) hr. |
| 1 1 0 1 1 | $A_{28}$ | " (4) PM/AM |
| 1 1 1 0 0 | $A_{29}$ | " (5) 1 min. |
| 1 1 1 0 1 | $A_{30}$ | " (5) 10 min. |
| 1 1 1 1 0 | $A_{31}$ | " (5) hr. |
| 1 1 1 1 1 | $A_{32}$ | " (5) PM/AM |

The term "data" given in the above table denotes time data stored in the memory cells of the memory circuit 6 specified by address pulses. For example, the data "1/256 second" includes 0/256 second, 1/256 second to 15/256. The data "1/16 second" includes 0/16 second, 1/16 second to 2/16 second to 15/16 second. The data "1 second" includes 0 second, 2 seconds to 9 seconds. The data "10 seconds" includes 00 second, 20 seconds to 50 seconds. The data "1 min" includes 0 minute, 2 minutes to 9 minutes. The data "10 minutes" includes 00 minute, 20 minutes to 50 minutes. The data "hour" includes 0 hour, 2 hours to 11 hours.

The above table has the following meaning. Where an output from the binary counter 4 has an address code "0,0,0,0,0", then the address decoder 5 generates an address pulse $A_1$ to designate the memory cell of the memory circuit 6 where the data "1/256 second" should be stored. When the timing pulse generator 2 supplies the succeeding timing pulse to the binary counter 4, then said counter produces an address code "0,0,0,0,1". The address decoder 5 gives forth the corresponding address pulse $A_2$ to designate the memory cell of the memory circuit 6 where the data "1/16 second" should be stored. Thus, a data stored in the binary counter changes, each time the timing pulse generator 2 sends forth a timing pulse to the binary counter 4. The address decoder 5 issues the corresponding address pulse $A_3$ to $A_{32}$ to specify the memory cells of the memory circuit 6 where the corresponding time data should be stored. As apparent from the above table, each of the address pulses $A_{13}$ to $A_{32}$ designates the memory cell of the memory circuit 6 where any alarm data included in the five groups should be stored.

There will now be described by reference to FIG. 4 the operation of the memory circuit 6. Now let it be assumed that a word-selecting line $W_1$ of the memory circuit 6 is supplied with a first address pulse $A_{1a}$ from the address pulse generator 3 to designate the memory cell of the memory circuit 6 connected to the word-selecting line $W_1$, where the data "1/256 second" should be stored. The read timing pulse $\phi_1$ and each address pulse $A_1$ to $A_{32}$ are emitted synchronously. When, therefore, the address pulse $A_{1a}$ is supplied to the word-selecting line $W_1$ of the memory circuit 6, then the read timing pulse $\phi_{1a}$ for reading out time data is conducted to the control terminal of the buffer circuit 8 to read out time data "0,0,0,0" stored in the memory cell specified by the address pulse $A_{1a}$. This time data "0,0,0,0" is supplied from the buffer circuit 8 to the first input terminals of the adder 9. Only where selection is made of the memory cell connected to the word-selecting line $W_1$ to be used as an address for read or write of time data, the address pulse $A_1$ is supplied to the adder 9 as a signal representing a minimum unit time. In the adder 9, therefore, a time data "0,0,0,0" delivered from the buffer circuit 6 is added to the minimum unit time to provide a time data coded as "0,0,0,1" denoting 1/256 second. This time data "0,0,0,1" is carried to the correction circuit 10. When the control terminal of the correction circuit 10 is supplied with a write timing pulse $\phi_{2a}$ (FIG. 4B) from the timing pulse generator 2, then one above-mentioned time data "0,0,0,1" is drawn out from the correction circuit 10 to be written in the memory cell designated by the address pulse $A_{1a}$, namely, the memory cell connected to the word-selecting line $W_1$. As later described, where a reset signal is supplied with respect to a time data delivered from the adder 9, then the correction circuit 10 clears said time data, and, where no reset signal is received, holds said time data.

Thereafter, the timing pulse generator 2 sends forth a second timing pulse $\phi_{1b}$ with a delay of 1/8192 second from the first read timing pulse $\phi_{1a}$. The second read timing pulse $\phi_{1b}$ is conducted to the binary counter 4 of the address pulse generator 3, causing the data already stored in the binary counter 4 to be changed to "0,0,0,0,1" shown in the address code column of the aforesaid table. This fresh data of the binary counter 4 having an address code "0,0,0,0,1" is decoded by the address decoder 5. As the result, the address pulse generator 3 issues an address pulse $A_{2a}$ corresponding to the address code "0,0,0,0, 1". The address pulse $A_{2a}$ is issued, as previously mentioned, with a delay of 1/8192 second from the preceding address pulse $A_{1a}$. The second address pulse $A_{2a}$ is transmitted to a word-selecting line $W_2$ to designate the memory cell connected to the word-selecting line $W_2$ where a time data "1/16 second" should be stored. As seen from FIGS. 4A and 4D, the read timing pulse $\phi_{1b}$ and address pulse $A_{2a}$ are simultaneously produced as described in connection with the address pulse $A_{1a}$. When, therefore, the address pulse $A_{2a}$ is supplied to the word-selecting line $W_2$, the read timing pulse $\phi_{1b}$ is simultaneously sent to the control terminal of the buffer circuit 8, causing a time data "0,0,0,0" stored in the memory cell designated by the address pulse $A_{2a}$ to be read out from the memory circuit 6. This time data "0,0,0,0" is supplied from the buffer circuit 8 to the adder 9. The address pulse $A_1$ is supplied to the adder 9 as a signal showing a minimum unit time 1/256 second, only where selection is made of the memory cell where a time data "1/256 second" should be stored. Where designation is made of a memory cell being stored with a time data "1/16 second", the address pulse $A_1$ as a signal denoting a minimum unit time 1/256 second is not supplied. In the adder 9 no signal is added to a time data "0,0,0,0" sent forth from the buffer circuit 8. Consequently, the adder 9 generates the same output as the time data "0,0,0,0" already received. This output time data "0,0,0,0" is carried to the correction circuit 10. When the control terminal of the correction circuit 10 receives a write timing pulse $\phi_{2b}$ from the timing pulse generator 2, said time data "0,0,0,0" is transmitted to the memory cell of the memory circuit 6 specified by the address pulse $A_{2a}$.

Similarly, when the timing pulse generator 2 produces a third read timing pulse $\phi_{1c}$, then the address pulse generator 3 issues an address pulse $A_{3a}$ in synchronization with said read timing pulse $\phi_{1c}$. This address pulse $A_{3a}$ is supplied to a word-selecting line $W_3$ connected to a memory cell where a time data of "one second" should be stored. At this time, the same operation is carried out as when the address pulse $A_{2a}$ is received.

Later as described above, address pulses are produced by the address pulse generator 3 in synchronization with timing pulses issued by the timing pulse generator 2 at a period of 1/8192. Upon receipt of these address pulses, the memory circuit 6 carries out a time-counting operation.

As apparent from the aforesaid table, the address pulse generator 3 issues 32 different address pulses $A_1$ to $A_{32}$ corresponding to the data stored in the binary counter 4, namely, address codes. Where a time-counting function up to the issue of the address pulses $A_1$ to $A_{32}$ is brought to an end, then the address pulse generator 3 sends forth an address pulse $A_{1b}$ in synchronization with a timing pulse $\phi_{1d}$ (FIG. 4A). As in the preceding case, the address pulse $A_{1b}$ is supplied to the word-selecting line $W_1$ of the memory circuit 6 designate the memory cell connected to the word-selecting line $W_1$ where a time data "1/256 second" should be stored. The timing pulse $\phi_{1d}$ issued from the timing pulse generator 2 is supplied to the address pulse generator 3 and also to the control terminal of the buffer circuit 8 to provide timing for readout of time data from the memory circuit 6. As the result, a time data "0,0,0,1" denoting 1/256 second is read out to the buffer circuit 8 from the memory cell designated by the address pulse $A_{1b}$. This time data "0,0,0,1" is supplied from the buffer circuit 8 to the adder 9. Where a memory cell for the read and write of a time data "1/256 second" is designated by the address pulse $A_1$, then the address pulse $A_1$ is supplied to the adder 9 as a signal showing a minimum unit time. As the result, the adder 9 produces an output time data "0,0,1,0" denoting 2/256 seconds obtained by adding the minimum unit time represented by the address pulse $A_1$ to a time data delivered from the memory circuit 6. This time data "0,0,1,0" is transmitted to the correction circuit 10. When the control terminal of the correction circuit 10 is supplied with a write timing pulse $\phi_{2c}$, then said time data "0,0,1,0" is stored in the designated memory cell of the memory circuit 6. Later when the timing pulse generator 2 sends forth a read timing pulse $\phi_{1e}$ to the binary counter 4 of the address pulse generator 3, then a data stored in the binary counter 4 is changed to "0,0,0,0,1". The address decoder 5 of the address pulse generator 3 decodes said data "0,0,0,1" and issues an address pulse $A_{2b}$. This address pulse $A_{2b}$ is supplied to the word-selecting line $W_2$ of the memory circuit 6 to designate the memory cell connected to the word-selecting line $W_2$ where a time data "1/16 second" should be stored. Upon receipt of a read timing pulse $\phi_{1e}$, a time data "0,0,0,0" stored in the memory cell is read out to the buffer circuit 8. The time data "0,0,0,0" is conducted from the buffer circuit 8 to the adder 9. The adder 9 which does not receive any signal to be added to the time data "0,0,0,0", issues the same output as the time data "0,0,0,0" to the correction circuit 10. When the control terminal of the correction circuit 10 is supplied with a write timing pulse $\phi_{2d}$, then said time data "0,0,0,0" is written in the memory cell of the memory circuit 6 designated by the address pulse $A_{2b}$.

Later as described above, the data of the binary counter 4 of the address pulse generator 3 is changed upon receipt of a read timing pulse $\phi_1$ from the timing pulse generator 2. Thus, the address pulse generator 3 produces address pulse $A_3$ to $A_{32}$ in turn. The memory cells of the memory circuit 6 are designated by these address pulses $A_3$ to $A_{32}$ to advance a time-counting operation.

Time data stored in the 32 memory cells of the memory circuit 6 are read out at a period of 1/8192 upon receipt of an address pulse from the address pulse generator 3. Namely, all time data stored in the 32 memory cells are read out in a total time of 1/8192 (second) $\times$ 32 = 1/256 (second).

With the prior art dynamic type electronic timepiece circuit, where each time data is formed of 4 bits, as in the embodiment of this invention, all time data stored in a memory circuit had to be shifted simultaneously at an extremely high frequency such as $1/256 \times 1/32 \times \frac{1}{4}$ (second) = $1/8192 \times \frac{1}{4}$ (second) = 1/32728 (second).

In contrast, the dynamic type electronic timepiece circuit of this invention makes it sufficient to shift 32 time data successively at a period of 1/8192 second. Namely, the respective cycles of shifting said 32 time data are carried out at a period of 1/256 second, enabling the respective time data to have a low shift frequency and effectively decreasing power consumption.

Time data delivered from the buffer circuit 8 are also supplied to the reset-judging circuit 11 and carry-judging circuit 12. Where the prescribed conditions are satisfied, the judging circuits 11, 12 issue reset and carry signals respectively.

There will now be described the operation of the reset-judging circuit 11 and carry-judging circuit 12 by reference to a time data "1/256 second" including a minimum unit time of 0/256 second to a maximum unit time of 15/256. Now let it be assumed that a time data stored in the memory cell designated the address pulse $A_1$ has a code "1,1,1,1" denoting 15/256 seconds. Then the code "1,1,1,1" is read out to the buffer circuit 8 upon receipt of a read timing pulse $\phi_1$. The time data is supplied to the display data memory circuit 16 and adder 9 and also to the reset-judging circuit 11 and carry-judging circuit 12. When supplied with the time data "1,1,1,1", the reset-judging circuit 11 judges that said time data has a maximum unit time 15/256 second, and is operated upon receipt of an AND signal $\phi_1.A_1$ composed of a timing pulse $\phi_1$ and address pulse $A_1$ from the AND circuit 15, and produces a reset signal. This reset signal is conducted to the reset signal-delaying circuit 13 upon receipt of a read timing pulse $\phi_1$. A reset signal held by the reset signal-delaying circuit 13 is supplied to the correction circuit 10 upon receipt of a write timing pulse $\phi_2$ when the time data issued from the buffer circuit 8 to the adder 9 is thereafter timing pulse $\phi_2$, thereby clearing the time data in the form of "0,0,0,0". The cleared time data "0,0,0,0" is delivered to the designated memory cell of the memory circuit 6 where the time data of "1/256 second" should be stored.

Where a time data read out from the memory circuit 6 through the buffer circuit 8 has a code "1,1,1,1" denoting 15/256 seconds, then the carry-judging circuit 12 is operated upon receipt of an AND signal $\phi_1.A_1$ composed of a timing pulse $\phi_1$ and an address pulse $A_1$ to produce a carry signal. This carry signal is supplied to the carry signal-delaying circuit 14 upon receipt of a timing pulse $\phi_1$. When a time data of "1/16 second" is read out upon receipt of a timing pulse $\phi_1$ from the corresponding memory cell of the memory circuit 6 designated by an address pulse $A_2$ issued in succession to an address pulse $A_1$ and is supplied to the adder 9, then the above-mentioned carry signal held by the carry signal-delaying circuit 14 is also sent forth to the adder 9 upon receipt of a timing pulse $\phi_2$. In the adder 9, the time data of "1/16 second" is added to the carry signal delivered from the carry signal-delaying circuit 14, namely, a binary "1" is added to the code of the time data of "1/16 second" read out from the memory circuit 6. After corrected in the correction circuit 10, a time data resulting from said addition is supplied to the memory circuit 6, thereby effecting the carry operation.

Where time correction is required, a control circuit 18 supplied with address pulses $A_1$ to $A_{32}$ is set for a time-correcting mode by operation of, for example, an external switch. A time correction signal issued from the control circuit 18 is delivered to the reset signal-delaying circuit 13 and carry signal-delaying circuit 14. The operation of setting an alarm time is carried out similarly by an output from the control circuit 18. An input signal S to the control circuit 18 denotes a signal supplied from the external switch.

The reset-judging circuit 11 and carry-judging circuit 12 should preferably be formed of complementary MOS transistor type read-only memory cells which consume a small amount of power and are easy to design.

Among the data issued from the buffer circuit 8, the time data which are read out from the memory cells designated by address pulses $A_1$ to $A_{12}$ are also sent forth to the display data memory circuit 16 when a control signal is supplied from the control circuit 18 to the display data memory circuit 16.

Among the time data delivered from the buffer circuit 8, alarm time-setting data read out from the memory cells designated by address pulses $A_{13}$ to $A_{32}$ are transmitted to the alarm data memory circuit 17 when the control circuit 18 issues a control signal to the display data memory circuit 16.

Among the memory cells designated by the address pulses $A_1$ to $A_{32}$, those designated by the address pulses $A_1$ to $A_{12}$ are stored with time data including "1/256 second", "1/16 second" . . . "month". The memory cells specified by the address pulses $A_{13}$ to $A_{32}$ are stored with five groups of alarm data. Supply of alarm data to the memory cells designated by the address pulses $A_{13}$ to $A_{32}$ is effected by setting the control circuit 18 operable by an external switch for an alarm data-receiving mode, and supplying a desired alarm data to the corresponding memory cell through the reset signal-delaying circuit 13, carry signal-delaying circuit 14, correction circuit 10 and adder 9.

A time data represented by a binary code stored in the display data represented by a binary code stored in the display data memory circuit 16 is supplied to the decoder 19 to be converted into a display signal denoting, for example, a numerical digit such as 1, 2, 3, etc. The display signal is further delivered to the display device 21 using, for example, liquid crystal for visible indication of time.

A time data from the display data memory circuit 16 and an alarm data from the alarm data memory circuit 17 are supplied to the corresponding input terminals of the exclusive OR circuit 20. This exclusive OR circuit 20 produces a low level signal only when the time data and alarm data are delivered to the corresponding input terminals of the exclusive OR circuit 20 at the same time, namely only at the arrival of a preset alarm time. This low level output is supplied to the display device 21 for display of an alarm.

According to the foregoing embodiment, the memory circuit 6 is formed of complementary MOS transistor type random access memory cells. However, the random access memory cell need not be limited to the above-mentioned type, but may obviously consist of, for example, a *p* or *n* channel MOS transistor.

Further, the random access memory cell may be formed of integrated injection logic circuit or bipolar transistor. Where, however, circuit integration and power consumption are taken into account, it is most preferred to use complementary MOS transistor as a random access memory cell.

As previously mentioned, a memory circuit being stored with time data which is used with an electronic timepiece embodying this invention is formed of a large number of matrix-arranged random access memory cells, eliminating the necessity of simultaneously shifting a large amount of time data and decreasing power consumption. Further, there is used as the memory cell a static complementary MOS transistor type random access memory cell which includes fewer components than a static shiftregister cell, enabling a chip to have a sufficiently small area for circuit integration.

What is claimed is:

1. An electronic timepiece which comprises a clock pulse oscillator; a timing pulse generator for dividing the frequency of a clock pulse produced by the clock pulse oscillator to issue a timing pulse; an address pulse generator for sending forth address pulses to designate a prescribed address being stored with a time data upon receipt of a timing pulse from the timing pulse generator; a memory circuit formed of a plurality of static random access memory cells arranged in the form of a matrix represented by a number of time data by a number of bits required to denote the code of each time data, and, when a word-selecting line connected to a memory cell is supplied with an address pulse designating said memory cell, sending forth a time data through a data line of the designated memory cell; a display device for displaying a time data read out from the memory circuit; a carry-judging circuit for deciding whether a time data issued from the memory cell should be carried up to an immediately following higher unit time level and generating a carry-instructing signal; a reset-judging circuit for generating a reset-judging circuit for generating a reset-instructing signal where carry is required, to clear the carried time data; a first delay circuit for holding a carry-instructing signal delivered from the carry-judging circuit until a time data being carried is received; a second delay circuit for holding a reset-instructing signal until a time data being cleared is received; an adder for adding a carry signal supplied from the first delay circuit and a minimum unit time signal to a time data read out from the memory circuit; and a correction circuit for correcting a time data delivered from said adder upon receipt of a reset signal from the second display circuit.

2. An electronic timepiece according to claim 1, wherein the static random access memory cell is formed of complementary MOS transistors.

3. The electronic timepiece according to claim 1, wherein the correction circuit clears a time data delivered from the adder in the form of logical "0" upon a reset signal from the second delay circuit.

4. An electronic timepiece according to claim 1, wherein said carry-judging circuit and reset-judging circuit are both formed of read-only memory cells.

5. An electronic timepiece according to claim 4, wherein said read-only memory cells are formed of complementary MOS transistors.

* * * * *